(12) United States Patent
Ho et al.

(10) Patent No.: US 7,410,916 B2
(45) Date of Patent: Aug. 12, 2008

(54) METHOD OF IMPROVING INITIATION LAYER FOR LOW-K DIELECTRIC FILM BY DIGITAL LIQUID FLOW METER

(75) Inventors: Dustin W. Ho, Fremont, CA (US); Juan Carlos Rocha-Alvarez, Sunnyvale, CA (US); Alexandros T. Demos, Fremont, CA (US); Kelvin Chan, Santa Clara, CA (US); Nagarajan Rajagopalan, Santa Clara, CA (US); Visweswaren Sivaramakrishnan, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 73 days.

(21) Appl. No.: 11/562,021

(22) Filed: Nov. 21, 2006

(65) Prior Publication Data

US 2008/0119058 A1    May 22, 2008

(51) Int. Cl.
*H01L 21/31* (2006.01)
(52) U.S. Cl. ............... 438/780; 438/784; 257/E21.271
(58) Field of Classification Search ................. 438/780, 438/784
See application file for complete search history.

(56) References Cited

U.S. PATENT DOCUMENTS

| | | | |
|---|---|---|---|
| 5,855,681 A | 1/1999 | Maydan et al. | |
| 6,495,233 B1 | 12/2002 | Shmurun et al. | |
| 6,846,515 B2 * | 1/2005 | Vrtis et al. | 427/255.29 |
| 6,913,992 B2 | 7/2005 | Schmitt et al. | |
| 7,297,376 B1 * | 11/2007 | Yim et al. | 427/578 |
| 7,332,445 B2 * | 2/2008 | Lukas et al. | 438/780 |
| 2003/0101938 A1 | 6/2003 | Ronsse et al. | |
| 2004/0197474 A1 * | 10/2004 | Vrtis et al. | 427/255.28 |
| 2006/0040507 A1 * | 2/2006 | Mak et al. | 438/758 |
| 2006/0078676 A1 * | 4/2006 | Lukas et al. | 427/248.1 |
| 2006/0102076 A1 | 5/2006 | Smith et al. | |

* cited by examiner

*Primary Examiner*—Alexander G Ghyka
(74) *Attorney, Agent, or Firm*—Patterson & Sheridan

(57) ABSTRACT

A method for depositing a low dielectric constant film by flowing a oxidizing gas into a processing chamber, flowing an organosilicon compound from a bulk storage container through a digital liquid flow meter at an organosilicon flow rate to a vaporization injection valve, vaporizing the organosilicon compound and flowing the organosilicon compound and a carrier gas into the processing chamber, maintaining the organosilicon flow rate to deposit an initiation layer, flowing a porogen compound from a bulk storage container through a digital liquid flow meter at a porogen flow rate to a vaporization injection valve, vaporizing the porogen compound and flowing the porogen compound and a carrier gas into the processing chamber, increasing the organosilicon flow rate and the porogen flow rate while depositing a transition layer, and maintaining a second organosilicon flow rate and a second porogen flow rate to deposit a porogen containing organosilicate dielectric layer.

18 Claims, 3 Drawing Sheets

METHOD OF IMPROVING INITIATION LAYER FOR LOW-K DIELECTRIC FILM BY DIGITAL LIQUID FLOW METER

BACKGROUND OF THE INVENTION

1. Field of the Invention

Embodiments of the present invention generally relate to the fabrication of integrated circuits. More particularly, embodiments of the present invention relate to a method for depositing organosilicate layers on a substrate.

2. Description of the Related Art

In the manufacture of integrated circuits, plasma processes are increasingly being used to replace thermal processes. Plasma processing provides several advantages over thermal processing. For example, plasma enhanced chemical vapor deposition (PECVD) allows deposition processes to be performed at substantially lower temperatures than the temperatures required in analogous thermal processes. This is advantageous for processes with stringent thermal budget demands, such as in very large scale or ultra-large scale integrated circuit (VLSI or ULSI) device fabrication.

In order to further reduce the size of devices on integrated circuits, it has become necessary to use conductive materials having low resistivity and to use insulators having low dielectric constants (low-k) to reduce the capacitive coupling between adjacent metal lines. Methods to form low-k dielectric layers include PECVD of organosilicate precursor gases to form organosilicate dielectric layers, such as carbon doped silicon oxide films. One challenge in this area has been to develop a carbon doped silicon oxide dielectric film that has a low k value, but also exhibits desirable adhesion properties to the underlying substrate or adjacent dielectric diffusion barrier layer materials which include silicon, silicon dioxide, silicon carbide, silicon nitride, oxygen-doped silicon carbide, titanium, titanium nitride, tantalum, tantalum nitride, tungsten, aluminum, copper, and combinations thereof. Inadequate adhesion may result in delamination of the low-k dielectric layer from the underlying substrate and potential failure of the device. One approach to enhancing adhesion of carbon doped silicon oxide films is inserting a thin silicon oxide film and a thin transition film between the carbon doped silicon oxide layer and the underlying barrier layer. However, the thin silicon oxide and transition layers must be a minor portion of the combined dielectric film to retain significant reduction in dielectric constant. Therefore there is a need for a process for making low dielectric constant materials with a controlled silicon oxide layer and transition layer.

SUMMARY OF THE INVENTION

Embodiments of the present invention generally provide a method for depositing a low dielectric constant film. In one embodiment the method provides depositing an organosilicate dielectric film by positioning a substrate within a processing chamber having a powered electrode, flowing one or more oxidizing gases into the processing chamber, flowing an organosilicon compound from a first bulk storage container through a first digital liquid flow meter at a first organosilicon flow rate to a first vaporization injection valve, vaporizing the organosilicon compound and flowing the organosilicon compound and a carrier gas into the processing chamber, maintaining the first organosilicon flow rate to deposit an initiation layer in the presence of an RF power, flowing a porogen compound from a second bulk storage container through a second digital liquid flow meter at a first porogen flow rate to a second vaporization injection valve, vaporizing the porogen compound and flowing the porogen compound with a carrier gas into the processing chamber, increasing the first organosilicon flow rate and the first porogen flow rate while depositing a transition layer in the presence of the RF power, and maintaining a second organosilicon flow rate and a second porogen flow rate to deposit a porogen containing organosilicate dielectric layer in the presence of the RF power.

In one embodiment, the first organosilicon flow rate is maintained for about 1 second, and the organosilicon compound may be tetramethylcyclotetrasiloxane, octamethylcyclotetrasiloxane, pentamethylcyclopentasiloxane, hexamethylcyclotrisiloxane, diethoxymethylsilane, dimethyldisiloxane, tetrasilano-2,6-dioxy-4,8-dimethylene, tetramethyldisiloxane, hexamethyldisiloxane, 1,3-bis(silanomethylene)-disiloxane, bis(1-methyldisiloxanyl)methane, bis(1-methyldisiloxanyl)propane, hexamethoxydisiloxane, dimethyldimethoxysilane, or dimethoxymethylvinylsilane. The porogen compound may be butadiene, isoprene, cyclohexadiene, bicycloheptadiene, 1-methyl-4-(1-methylethyl)-1,3-cyclohexadiene, norbornadiene, 1-methyl-4-(1-methylethyl)-Benzene, 3-carene, fenchone, limonene, cyclopentene oxide, vinyl-1,4-dioxinyl ether, vinyl furyl ether, vinyl-1,4-dioxin, vinyl furan, methyl furoate, furyl formate, furyl acetate, furaldehyde, difuryl ketone, difuryl ether, difurfuryl ether, furan, or 1,4-dioxin. The porogen compound may have a first porogen flow rate of between about 200 mg/min and 600 mg/min, and a ramp-up rate of between about 400 mg/min./sec. and about 800 mg/min./sec.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Incorporated by reference herein for all purposes are U.S. Pat. Nos. 6,541,367, 6,596,627, and 6,913,992. These patents describe depositing a nano-porous silicon oxide layer having a low dielectric constant. The nano-porous silicon oxide layer is produced by plasma enhanced (PECVD) or microwave enhanced chemical vapor deposition of a silicon/oxygen containing material that optionally contains thermally labile organic groups, and by controlled annealing of the deposited silicon/oxygen containing material to form microscopic voids that are uniformly dispersed in a silicon oxide layer. The relative volume of the microscopic gas pockets to the silicon oxide layer is controlled to preferably maintain a closed cell foam structure that provides low dielectric constants after annealing. The nano-porous silicon oxide layers will have dielectric constants less than about 3.0, preferably less than about 2.5.

Embodiments of the invention are illustratively described below in reference to modification of a PRODUCER® SE CVD system or a DXZ® CVD system, both commercially available from Applied Materials, Inc., Santa Clara, Calif. The Producer® SE CVD system (e.g., 200 mm or 300 mm) has two isolated processing regions that may be used to deposit carbon-doped silicon oxides and other materials and is described in U.S. Pat. No. 5,855,681 and U.S. Pat. No. 6,495,233, which are incorporated by reference herein. The DXZ® CVD chamber is disclosed in U.S. Pat. No. 6,364,954, issued Apr. 2, 2002, which is incorporated herein by reference.

Figure 1:
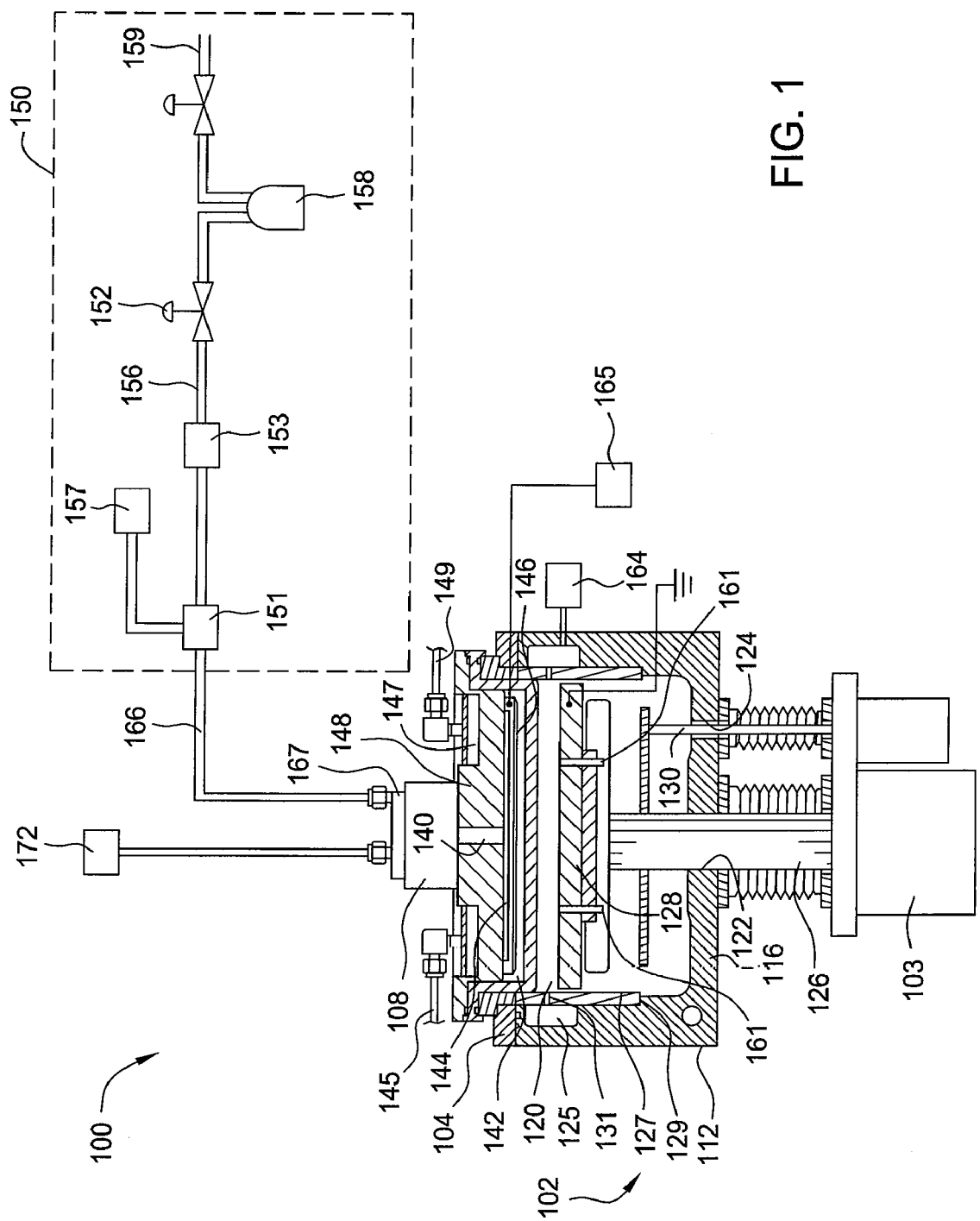
FIG. 1 illustrates a PECVD system in accordance with one embodiment of the present invention.

FIG. 1 illustrates a cross sectional view of a PECVD system 100 in accordance with one embodiment of the present invention. The PECVD system 100 generally comprises a chamber body 102 supporting a chamber lid 104 which may be attached to the chamber body 102 by a hinge. The chamber body 102 comprises sidewalls 112 and a bottom wall 116 defining a processing region 120. The chamber lid 104 may comprise one or more gas distribution systems 108 disposed therethrough for delivering reactant and cleaning gases into the processing region 120. A circumferential pumping channel 125 formed in the sidewalls 112 and coupled to a pumping system 164 is configured for exhausting gases from the processing region 120 and controlling the pressure within the processing region 120. Two passages 122 and 124 are formed in the bottom wall 116. A stem 126 of a heater pedestal 128 for supporting and heating a substrate being processed passes through the passage 122. A rod 130 configured to activate substrate lift pins 161 passes through the passage 124.

The heater pedestal 128 is movably disposed in the processing region 120 driven by a drive system 103 coupled to the stem 126. The heater pedestal 128 may comprise heating elements, for example resistive elements, to heat a substrate positioned thereon to a desired process temperature. Alternatively, the heater pedestal 128 may be heated by an outside heating element such as a lamp assembly. The drive system 103 may include linear actuators, or a motor and reduction gearing assembly, to lower or raise the heater pedestal 128 within the processing region 120.

A chamber liner 127, preferably made of ceramic or the like, is disposed in the processing region 120 to protect the sidewalls 112 from the corrosive processing environment. The chamber liner 127 may be supported by a ledge 129 formed in the sidewalls 112. A plurality of exhaust ports 131 may be formed on the chamber liner 127. The plurality of exhaust ports 131 is configured to connect the processing region 120 to the circumferential pumping channel 125.

The gas distribution assembly 108 configured to deliver reactant and cleaning gases is disposed through the chamber lid 104 to deliver gases into the processing region 120. The gas distribution assembly 108 includes a gas inlet passage 140 which delivers gas into a shower head assembly 142. The showerhead assembly 142 is comprised of an annular base plate 148 having a blocker plate 144 disposed intermediate to a faceplate 146. An RF (radio frequency) source 165 coupled to the shower head assembly 142 provides a bias potential to the shower head assembly 142 to facilitate generation of a plasma between the faceplate 146 of the shower head assembly 142 and the heater pedestal 128. In one embodiment RF source 165 may be a high frequency radio frequency (HFRF) power source, e.g., a 13.56 MHz RF generator. In another embodiment RF source 165 may include a HFRF power source and a low frequency radio frequency (LFRF) power source, e.g. a 300 kHz RF generator.

A cooling channel 147 is formed in the annular base plate 148 of the gas distribution system 108 to cool the annular base plate 148 during operation. A cooling inlet 145 delivers a coolant fluid, such as water or the like, into the cooling channel 147. The coolant fluid exits the cooling channel 147 through a coolant outlet 149.

The chamber lid 104 further comprises matching passages to deliver gases from one or more gas inlets 166 and one or more gas sources 172 configured to provide a carrier gas and/or a precursor gas.

One or more processing gases may be delivered to the processing region 120 via the gas inlet manifold 167. Typically, there are three methods to form a gas or vapor from a precursor to be delivered to a processing region of a processing chamber to deposit a layer of desired material on a substrate. The first method is a sublimation process in which the precursor in a solid form is vaporized using a controlled process which allows the precursor to change phase from a solid to a gas (or vapor) in an ampoule. The second method is to generate a gas of a precursor by an evaporation process, in which a carrier gas is bubbled through a temperature controlled liquid precursor and the carrier gas carries away the precursor gas. In the third method, a precursor gas is generated in a liquid delivery system in which a liquid precursor is delivered to a vaporizer, in which the liquid precursor changes state from a liquid to a gas by additional energy transferred to the vaporizer. A PECVD system generally comprises one or more precursor delivery systems.

FIG. 1 schematically illustrates a liquid delivery gas source 150 having a digital liquid flow meter 153. A low vapor pressure liquid precursor can be stored in a bulk storage container (ampoule) 158 located remotely or in close proximity to processing chamber body 102. Liquid precursor stored in container 158 is maintained under pressure of an inert gas such as helium or nitrogen at about 15 to 60 psig supplied by supply line 159. The gas pressure within container 158 provides sufficient pressure on the liquid precursor such that liquid precursor flows to other vapor delivery system components, thus removing the need for a pump to deliver the liquid precursor. The outlet of container 158 is provided with a shut-off valve 152 to isolate bulk storage container 158 for maintenance or replenishment of the liquid precursor. As a result of the pressure head on container 158, liquid precursor from container 158 is provided to a precursor supply line 156 and the digital liquid flow meter 153 which measures the amount of precursor flowing through. The liquid precursor flows from the liquid flow meter 153 to a vaporizing injection valve 151 which vaporizes the liquid precursor into a precursor gas and transfers the precursor gas through gas inlet 166 to the chamber.

Digital liquid flow meter (LFM) 153 and vaporizing injection valve 151 may be used to determine and control the flow rate of the precursor gas supplied to the processing region 120 during process. In one embodiment, the digital liquid flow meter 153 may be a LF-F Series Digital Liquid Mass Flow Meter/Controller, commercially available from Horiba/Stec. Upon digital LFM 153 receiving a flow set point, digital LFM 153 instantaneously adjusts or discharges an internal valve voltage in the vaporizing injection valve 151 to set the desired flow rate. At the same time PID (proportional-integral-derivative) control is also initiated. The instantaneous internal valve voltage discharge may reduce flow set response time by about 50% while improving the flow accuracy from about +/−2% to about +/−1%, as compared to the response time and flow accuracy when using conventional analog liquid flow meters. The PID control of digital LFM 153 can optimize response times automatically and record PID parameters digitally which may be observed on a computer monitor, replacing analog PID tuning by adjusting a diode on the LFM body.

Carrier gas supply 157 supplies a carrier gas such as helium or nitrogen to the vaporizing injection valve 151. The carrier gas may be passed through a heat exchanger (not shown) which preheats the carrier gas to a temperature such that the heated carrier gas stream entering vaporizing injection valve 151 does not interfere with the efficient vaporization of the precursor liquid undergoing vaporization within vaporizing injection valve 151. In one embodiment, the gas heat exchanger may heat the gas using a resistive heater like the carrier gas heat exchanger Model HX-01 commercially available from Lintec.

Although FIG. 1 depicts one liquid delivery gas source 150, it is contemplated that PECVD system 100 may include two or more such liquid delivery gas sources 150, depending on how many liquid precursors are to be introduced to the chamber.

Figure 2:
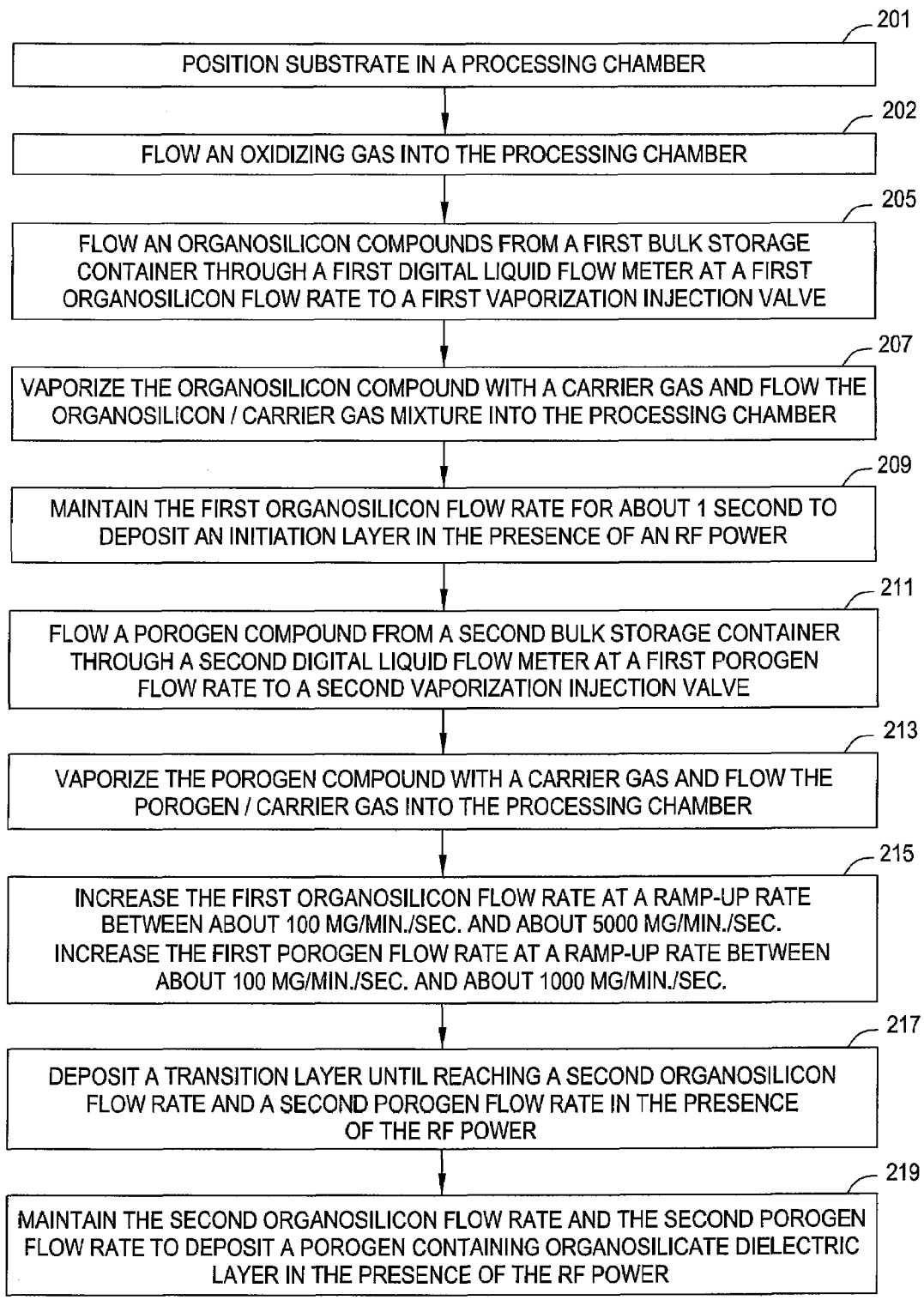
FIG. 2 is a process flow diagram illustrating a method for forming a organosilicate dielectric layer according to an embodiment of the invention.

FIG. 2 is a process flow diagram illustrating a method of depositing an organosilicate dielectric layer according to an embodiment of the invention. The silicon/oxygen material is chemical vapor deposited by reacting one or more organosilicon compounds and one or more unsaturated non-silicon compounds having thermally labile groups (porogen) with one or more oxidizing gases. In step 201, a substrate is positioned on a substrate support in a processing chamber capable of performing PECVD. In step 203, one or more oxidizing gases are introduced into the chamber through a gas distribution plate, such as a showerhead. In step 205, an organosilicon compound is flowed from a first bulk storage container through a first digital liquid flow meter and to a first vaporization injection valve. The first digital liquid flow meter controls and monitors the flow rate of the organosilicon compound. In step 207 the organosilicon compound is vaporized and combined with an inert carrier gas and the combined organosilicon/carrier gas mixture introduced to the processing chamber through a gas distribution plate, such as a showerhead. In step 209, the organosilicon compound is flowed at a first organosilicon flow rate for about one second while a radio-frequency (RF) power is applied to an electrode, such as the showerhead, in order to provide plasma processing conditions in the chamber. The gas mixture is reacted in the chamber in the presence of the RF power to deposit an initiation layer comprising a silicon oxide layer that adheres strongly to the underlying substrate.

In step 211, a porogen compound is flowed from a second bulk storage container through a second digital liquid flow meter and to a second vaporization injection valve. The second digital liquid flow meter controls and monitors the flow rate of the porogen compound. In step 213 the porogen compound is vaporized and combined with an inert carrier gas and the combined porogen/carrier gas mixture introduced to the processing chamber through a gas distribution plate, such as a showerhead, upon the completion of the initiation layer deposition of step 209. In step 215, the flow rate of the organosilicon compound is increased at a ramp-up rate between about 100 mg/min./sec. and about 5000 mg/min./sec., preferably, between about 1000 mg/min./sec. and about 2000 mg/min./sec. Also in step 215, the flow rate of the one or more porogen compounds is increased at a ramp-up rate between about 100 mg/min./sec. and about 5000 mg/min./sec., preferably, between about 200 mg/min./sec. and about 1000 mg/min./sec., more preferably between about 400 mg/min./sec. and about 800 mg/min./sec. RF power is applied in order to deposit a transition layer until reaching a second organosilicon flow rate and a second porogen flow rate. The increase in flow rate of the organosilicon compound and the increase in flow rate of the one or more porogen compounds may occur concurrently, so that immediately after the initiation layer deposition the flow rate of the organosilicon compound is ramped-up as the porogen compound is introduced and the porogen flow rate ramped up (step 217). In this embodiment one transition layer is formed. Alternatively, the increase in flow rate of the organosilicon compound may be partially or entirely completed before the introduction of any porogen compound, so that a first transition layer is formed while ramping-up the first organosilicon flow rate without any porogen compound present. Upon completion or partial completion of the ramp-up of the organosilicon compound a second transition layer is formed by introducing and ramping-up the flow rate of the porogen compound.

Upon completion of the transition layer deposition (step 217), the organosilicon flow rate is kept at a second organosilicon flow rate and the porogen flow rate maintained at a second porogen flow rate to deposit a porogen containing organosilicate dielectric layer in the presence of the RF power (step 219).

Figure 3:
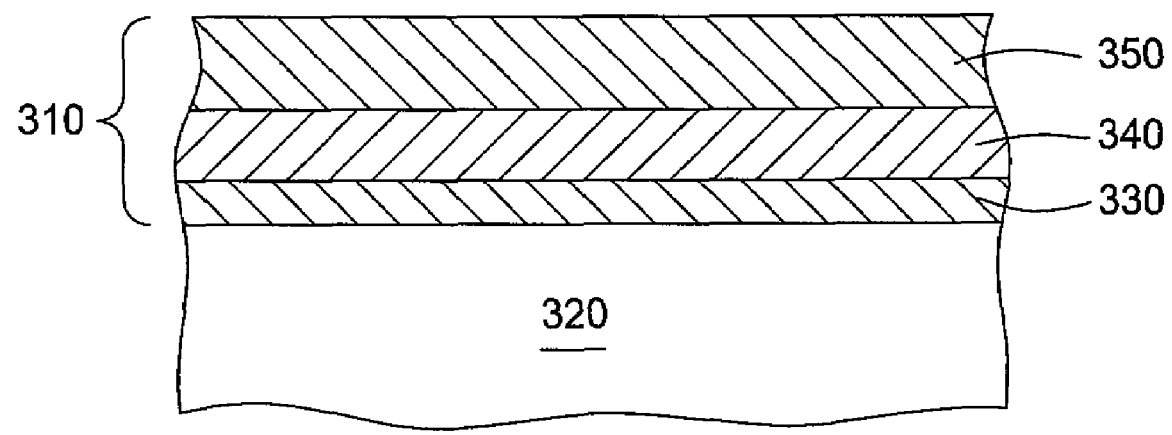
FIG. 3 is a cross-sectional view of a structure including an organosilicate dielectric layer formed according to embodiments of the invention.

FIG. 3 schematically illustrates a cross-sectional view of a porogen organosilicate dielectric layer formed according to embodiments of the present invention. An organosilicate dielectric layer 310 is deposited on an underlying layer (e.g., barrier layer) 320 of the surface of a substrate disposed in a processing chamber capable of performing PECVD. A plasma of the gas mixture comprising a flow rate of one or more organosilicon compounds is formed, as described above with respect to step 209 of FIG. 2, to deposit a pure silicon oxide initiation layer 330 having strong adhesion to the underlying layer 320. The initiation layer 330 may be deposited to a thickness in a range of about 5 Å to about 100 Å, preferably about 20 Å to about 60 Å.

After depositing the initiation layer 330, a transition layer 340 is formed during the ramp-up of the organosilicon flow rate and the ramp-up of the porogen flow rate, as described above with respect to step 217 of FIG. 2. The transition layer 340 may have a gradient concentration of porogen where the concentration of porogen in the silicon oxide layer increases as the porogen silicon oxide layer is deposited. The increased control of the flow rates of the organosilicon compound and of the porogen compound enables transition layer deposition to result in a transition layer 340 thickness of about 200 Å or less, preferably between about 150 Å and about 200 Å.

Upon reaching the final gas mixture composition, a plasma of the final gas mixture comprising a second organosilicon flow rate and a second porogen flow rate is formed, as described above with respect to step 219 of FIG. 2, to deposit a porogen-containing organosilicate dielectric layer 350. The porogen-containing organosilicate dielectric layer 350 may be deposited to a thickness in a range of about 200 Å to about 10,000 Å until the RF power is terminated.

Reducing the thickness of initiation layer 330 and transition layer 340 also reduces the over all dielectric constant of organosilicate dielectric layer 310 from about 2.55 for an organosilicate dielectric layer deposited using an analog LFM to a dielectric constant of about 2.50. Additionally, the film stress of organosilicate dielectric layer 310 may be reduced from about 61 MPa to about 58 MPa, and the adhesion strength of organosilicate dielectric layer 310 to the underlying layer 320 may be increased from about 5.7 $J/m^2$ to about 6.0 $J/m^2$.

The increased control of the flow rate of the porogen compound results in less particle defects forming in organosilicate dielectric layer 310. With an initial porogen flow of 200 mg/min., less than about 10 defects may be observed for porogen ramp-up rates between about 400 mg/min./sec. and about 800 mg/min./sec. For porogen having an initial porogen flow of 400 mg/min., less than about 10 defects may be observed for porogen ramp-up rates between about 400 mg/min./sec. and about 600 mg/min./sec. and between 700 mg/min./sec. and about 800 mg/min./sec. However, at a ramp-up rate of about 650 mg/min./sec. almost 100 defects may be observed. With an initial porogen flow of about 600 mg/min. and porogen ramp-up rates between about 400 mg/min./sec. and about 800 mg/min./sec. the observed defect may count over about 100.

Precursors and Processing Conditions for Deposition of Organosilicate Layers

In any of the embodiments described herein, an organosilicate dielectric layer is deposited from a process gas mixture comprising an organosilicon compound and a porogen. The organosilicate layer may be used as a dielectric layer. The dielectric layer may be used at different levels within a device. For example, the dielectric layer may be used as a premetal dielectric layer, an intermetal dielectric layer, or a gate dielectric layer. The organosilicate layer is preferably a low-k dielectric layer, i.e., having a dielectric constant of about 2.50.

A wide variety of process gas mixtures may be used to deposit the organosilicate dielectric layer, and non-limiting examples of such gas mixtures are provided below. Generally, the gas mixture includes one or more organosilicon compounds (e.g., a first and a second organosilicon compound), one or more porogen compounds, a carrier gas, and an oxidizing gas. These components are not to be interpreted as limiting, as many other gas mixtures including additional components such as hydrocarbons (e.g., aliphatic hydrocarbons) are contemplated.

The term "organosilicon compound" as used herein is intended to refer to silicon-containing compounds including carbon atoms in organic groups. The organosilicon compound may include one or more cyclic organosilicon compounds, one or more aliphatic organosilicon compounds, or a combination thereof. Some exemplary organosilicon compounds include tetramethylcyclotetrasiloxane (TMCTS), octamethylcyclotetrasiloxane (OMCTS), pentamethylcyclopentasiloxane, hexamethylcyclotrisiloxane, diethoxymethylsilane (DEMS), dimethyldisiloxane, tetrasilano-2,6-dioxy-4,8-dimethylene, tetramethyldisiloxane, hexamethyldisiloxane (HMDS), 1,3-bis(silanomethylene)disiloxane, bis(1-methyldisiloxanyl)methane, bis(1-methyldisiloxanyl)propane, hexamethoxydisiloxane (HMDOS), dimethyldimethoxy-silane (DMDMOS), and dimethoxymethylvinylsilane (DMMVS), or derivatives thereof. The one or more organosilicon compounds may be introduced into the processing chamber at a flow rate in a range of about 10 mg/min. to about 5,000 mg/min., preferably between about 300 mg/min. and about 3,000 mg/min.

The term "porogen compound" as used herein is intended to refer to unsaturated non-silicon bearing components having thermally labile groups that have the property of reacting with a plasma-sustained oxidizing environment to form thermally labile molecules that deposit, and which, when subsequently exposed to elevated temperatures, thermally decompose to form volatile species with low boiling points. Decomposition and evolution of the thermally labile group's volatile species from the deposited film will leave voids in the structure, reducing the structure's density. Selectively removing embedded chemically reacted solid material within the deposited film by a thermal process results in low density films which have low dielectric constants. Some exemplary porogen compounds include linear or cyclic molecules such as butadiene, isoprene, cyclohexadiene, bicycloheptadiene, 1-methyl-4-(1-methylethyl)-1,3-cyclohexadiene (ATP or alpha-Terpinene), norbornadiene, 1-methyl-4-(1-methylethyl)-Benzene (Cymene), 3-carene, fenchone, limonene, cyclopentene oxide, vinyl-1,4-dioxinyl ether, vinyl furyl ether, vinyl-1,4-dioxin, vinyl furan, methyl furoate, furyl formate, furyl acetate, furaldehyde, difuryl ketone, difuryl ether, difurfuryl ether, furan, 1,4-dioxin, and fluorinated carbon derivatives thereof. The one or more porogen compounds may be introduced into the processing chamber at a flow rate in a range of about 10 mg/min. to about 5,000 mg/min., preferably between about 500 mg/min. and about 3,000 mg/min.

The gas mixture optionally includes one or more carrier gases. Typically, one or more carrier gases are introduced with the one or more organosilicon compounds and the one or more porogen compounds into the processing chamber. Examples of carrier gases that may be used include helium, argon, carbon dioxide, and combinations thereof. The one or more carrier gases may be introduced into the processing chamber at a flow rate less than about 20,000 sccm, depending in part upon the size of the interior of the chamber. Preferably the flow of carrier gas is in a range of about 500 sccm to about 1,500 sccm, and more preferably about 1,000 sccm. In some processes, an inert gas such as helium or argon is put into the processing chamber to stabilize the pressure in the chamber before reactive process gases are introduced.

The gas mixture also includes one or more oxidizing gases. Suitable oxidizing gases include oxygen ($O_2$), ozone ($O_3$), nitrous oxide ($N_2O$), carbon monoxide (CO), carbon dioxide ($CO_2$), and combinations thereof. The flow of oxidizing gas may be in a range of about 100 sccm to about 3,000 sccm, depending in part upon the size of the interior of the chamber. Typically, the flow of oxidizing gas is in a range of about 100 sccm to about 1,000 sccm. Disassociation of oxygen or the oxygen containing compounds may occur in a microwave chamber prior to entering the deposition chamber and/or by RF power as applied to process gas within the chamber.

During deposition, a controlled plasma is typically formed in the chamber adjacent to the substrate by RF energy applied to the showerhead using an RF power supply 165 as depicted in FIG. 1. Alternatively, RF power can be provided to the substrate support. The plasma may be generated using high frequency RF (HFRF) power, as well as low frequency RF (LFRF) power (e.g., dual frequency RF), constant RF, pulsed RF, or any other known or yet to be discovered plasma generation technique. The RF power supply 165 can supply a single frequency RF between about 5 MHz and about 300 MHz. In addition, the RF power supply 165 may also supply a single frequency LFRF between about 300 Hz to about 1,000 kHz to supply a mixed frequency to enhance the decomposition of reactive species of the process gas introduced into the process chamber. The RF power may be cycled or pulsed to reduce heating of the substrate and promote greater porosity in the deposited film. Suitable RF power may be a power in a range of about 10 W to about 5,000 W, preferably in a range of about 200 W to about 1000 W. Suitable LFRF power may be a power in a range of about 0 W to about 5,000 W, preferably in a range of about 0 W to about 200 W.

During deposition, the substrate is maintained at a temperature between about −20° C. and about 500° C., preferably between about 100° C. and about 450° C. The deposition pressure is typically between about 1 Torr and about 20 Torr, preferably between about 4 Torr and about 10 Torr. The deposition rate is typically between about 2,000 Å/min. and about 20,000 Å/min.

Preferably, after the low dielectric constant film is deposited, the film is post-treated. The film may be post-treated with a thermal or plasma enhanced annealing process or an electron beam treatment. In one embodiment, the film is annealed at a temperature between about 200° C. and about 400° C. for about 2 seconds to about 1 hour, preferably about 30 minutes. A non-reactive gas such as helium, hydrogen, nitrogen, or a mixture thereof is introduced at a rate of 100 to about 10,000 sccm. The chamber pressure is maintained between about 2 Torr and about 10 Torr. The RF power during the annealing is about 200 W to about 1,000 W at a frequency of about 13.56 MHz, and the preferable substrate spacing is between about 300 mils and about 800 mils. Annealing the low dielectric constant film at a substrate temperature of about 200° C. to about 400° C. after the low dielectric constant film is deposited volatilizes at least some of the organic groups in the film, forming voids in the film. Organic groups that may be volatilized are derived from organic components of the gas mixtures described herein, such as the ring of the one or more oxygen-free hydrocarbon compounds comprising one ring and one or two carbon-carbon double bonds in the ring.

In another embodiment, the low dielectric constant film is post-treated with an electron beam treatment. The e-beam treatment typically has a dose between about 50 and about 2000 micro coulombs per square centimeter ($\mu c/cm^2$) at about 1 to 20 kiloelectron volts (KeV). The e-beam treatment is typically operated at a temperature between about room-temperature and about 450° C. for about 1 minute to about 15 minutes, such as about 2 minutes. Preferably, the e-beam treatment is performed at about 400° C. for about 2 minutes. In one aspect, the e-beam treatment conditions include 4.5 kV, 1.5 mA and 150 pc/cm$^2$ at 400° C. Although any e-beam device may be used, one exemplary device is the EBK chamber, available from Applied Materials, Inc.

The e-beam curing process improves mechanical strength of the deposited film network and also lowers the k-value. The energized e-beam alters the chemical bonding in the molecular network of the deposited film and removes at least a portion of the molecular groups, such as organic components from the ring of the one or more oxygen-free hydrocarbon compounds comprising one ring and one or two carbon-carbon double bonds in the ring, from the film. The removal of the molecular groups creates voids or pores within the film, lowering the k value. The e-beam treatment also strengthens the film network by cross-linking Si—O—Si or Si—C—Si chains as inferred from FTIR spectroscopy.

In another embodiment, the low dielectric constant film is post-treated by an ultraviolet curing process. Low dielectric constant films cured using the ultraviolet curing process have shown improved barrier layer properties and have shown reduced and minimal resist poisoning. The ultraviolet curing process may be performed in situ within the same processing chamber or system, for example, transferred from one chamber to another without a break in vacuum.

The substrate is introduced into a chamber, which may include the deposition chamber, and the low dielectric constant film is exposed to between about 0.01 milliWatts/cm$^2$ and about 1 watts/cm$^2$ of ultraviolet radiation, for example, between about 0.1 milliWatts/cm$^2$ and about 10 milliwatts/cm$^2$. The ultraviolet radiation may comprise a range of ultraviolet wavelengths, and include one or more simultaneous wavelengths. Suitable ultraviolet wavelengths include between about 1 nm and about 400 nm, and may further include optical wavelengths up to about 600 or 780 nm. The ultraviolet wavelengths between about 1 nm and about 400 nm, may provide a photon energy (electroVolts) between about 11.48(eV) and about 3.5(eV). Preferred ultraviolet wavelengths include between about 100 nm and about 350 nm.

Further, the ultraviolet radiation may be applied at multiple wavelengths, a tunable wavelength emission and tunable power emission, or a modulation between a plurality of wavelengths as desired, and may be emitted from a single UV lamp or applied from an array of ultraviolet lamps. The deposited organosilicate dielectric layer is exposed to the ultraviolet radiation for between about 10 seconds and about 600 seconds.

During processing, the temperature of the processing chamber may be maintained at between about 0° C. and about 550° C., for example, between about 20° C. and about 400° C. degrees Celsius, for example about 25° C., and at a chamber pressure between vacuum, for example, less than about 1 mTorr up to about atmospheric pressure, i.e., 760 Torr, for example at about 100 Torr. The source of ultraviolet radiation may be between about 100 mils and about 600 mils from the substrate surface. Optionally, a processing gas may be introduced during the ultraviolet curing process. Suitable processing gases include oxygen ($O_2$), nitrogen ($N_2$), hydrogen ($H_2$), helium (He), argon (Ar), water vapor ($H_2O$), carbon monoxide, carbon dioxide, hydrocarbon gases, fluorocarbon gases, and fluorinated hydrocarbon gases, or combinations thereof. The hydrocarbon compounds may have the formula $C_xH_y$, $C_xF_y$, $C_xF_yH_z$, or combinations thereof, with x an integer between 1 and 6, y is an integer between 4 and 14, and z is an integer between 1 and 3.

EXAMPLE

Organosilicate dielectric layers were deposited on a substrate in accordance with the embodiment described above with respect to FIG. 2. The films were deposited using a PECVD chamber (i.e., CVD chamber) on a PRODUCER system, available from Applied Materials, Inc. of Santa Clara, Calif. During deposition the chamber pressure was maintained at a pressure of about 4.5 Torr and the substrate was maintained at a temperature of about 350° C.

The substrate was positioned on a substrate support disposed within a process chamber. The process gas mixture having an initial gas composition of 1000 sccm helium and 700 sccm oxygen for the interface layer was introduced into the chamber and flow rates stabilized before initiation of the RF power. Subsequently, RF power of about 500 W was applied to the showerhead to form a plasma of the interface process gas mixture composition including diethoxymethylsilane (DEMS). After initiation of the RF power for about 1 second, 1-methyl-4-(1-methylethyl)-1,3-cyclohexadiene (ATP) was introduced to the chamber at flow rates between about 200 mg/min. and about 600 mg/min. and immediately ramped-up at ramp up rates between about 400 mg/min./sec. and 800 mg/min./sec while increasing the DEMS flow rate at a ramp-up rate of about 1500 mg/min./sec. until reaching a ATP flow rate of about 2950 mg/min.

Examples of varying porogen transition flow rates and porogen ramp-up rates and their effect on the total number of particle adders are presented in the table below.

| ATP Initial Flow Rate (mg/min.) | ATP Ramp Rate (mg/min./sec.) | Defects |
|---|---|---|
| 200 | 400 | Below 10 |
| 200 | 500 | Below 10 |
| 200 | 650 | Below 10 |
| 200 | 700 | Below 10 |
| 200 | 800 | Below 10 |
| 400 | 400 | Below 10 |

-continued

| ATP Initial Flow Rate (mg/min.) | ATP Ramp Rate (mg/min./sec.) | Defects |
|---|---|---|
| 400 | 500 | Below 10 |
| 400 | 650 | Above 10 |
| 400 | 700 | Below 10 |
| 400 | 800 | Below 10 |
| 600 | 400 | Above 10 |
| 600 | 500 | Above 10 |
| 600 | 650 | Above 10 |
| 600 | 700 | Above 1000 |
| 600 | 800 | Above 1000 |

While the foregoing is directed to embodiments of the present invention, other and further embodiments of the invention may be devised without departing from the basic scope thereof, and the scope thereof is determined by the claims that follow.

The invention claimed is:

1. A method of depositing an organosilicate dielectric layer, comprising:
    positioning a substrate within a processing chamber having a powered electrode;
    flowing one or more oxidizing gases into the processing chamber;
    flowing an organosilicon compound from a first bulk storage container through a first digital liquid flow meter at a first organosilicon flow rate to a first vaporization injection valve;
    vaporizing the organosilicon compound and flowing the organosilicon compound and a first carrier gas into the processing chamber;
    maintaining the first organosilicon flow rate to deposit an initiation layer in the presence of an RF power;
    flowing a porogen compound from a second bulk storage container through a second digital liquid flow meter at a first porogen flow rate to a second vaporization injection valve;
    vaporizing the porogen compound and flowing the porogen compound and a second carrier gas into the processing chamber;
    increasing the first organosilicon flow rate and the first porogen flow rate while depositing a transition layer in the presence of the RF power; and
    maintaining a second organosilicon flow rate and a second porogen flow rate to deposit a porogen containing organosilicate dielectric layer in the presence of the RF power.

2. The method of claim 1, wherein the first organosilicon flow rate is maintained for about 1 second.

3. The method of claim 1, wherein the first porogen flow rate is between about 200 mg/min and 600 mg/min.

4. The method of claim 1, wherein the organosilicon compound is selected from the group consisting of tetramethylcyclotetrasiloxane, octamethylcyclotetrasiloxane, pentamethylcyclopentasiloxane, hexamethylcyclotrisiloxane, diethoxymethylsilane, dimethyldisiloxane, tetrasilano-2,6-dioxy-4,8-dimethylene, tetramethyldisiloxane, hexamethyldisiloxane, 1,3-bis(silanomethylene)disiloxane, bis(1-methyldisiloxanyl)methane, bis(1-methyldisiloxanyl)propane, hexamethoxydisiloxane, dimethyldimethoxysilane, and dimethoxymethylvinylsilane.

5. The method of claim 1, wherein the porogen compound is selected from the group consisting of butadiene, isoprene, cyclohexadiene, bicycloheptadiene, 1-methyl-4-(1-methylethyl)-1,3-cyclohexadiene, norbornadiene, 1-methyl-4-(1-methylethyl)-Benzene, 3-carene, fenchone, limonene, cyclopentene oxide, vinyl-1,4-dioxinyl ether, vinyl furyl ether, vinyl-1,4-dioxin, vinyl furan, methyl furoate, furyl formate, furyl acetate, furaldehyde, difuryl ketone, difuryl ether, difurfuryl ether, furan, and 1,4-dioxin.

6. The method of claim 1, wherein the one or more oxidizing gases is selected from the group consisting of oxygen, ozone, nitrous oxide, carbon monoxide, and carbon dioxide.

7. The method of claim 4, wherein the organosilicon compound comprises diethoxymethylsilane and the porogen compound comprises 1-methyl-4-(1-methylethyl)-1,3-cyclohexadiene.

8. A method of depositing an organosilicate dielectric layer, comprising:
    positioning a substrate within a processing chamber having a powered electrode;
    flowing one or more oxidizing gases into the processing chamber;
    flowing an organosilicon compound from a first bulk storage container through a first digital liquid flow meter at a first organosilicon flow rate to a first vaporization injection valve;
    vaporizing the organosilicon compound and flowing the organosilicon compound and a first carrier gas into the processing chamber;
    maintaining the first organosilicon flow rate for about one second to deposit an initiation layer in the presence of an RF power;
    flowing a porogen compound from a second bulk storage container through a second digital liquid flow meter at a first porogen flow rate to a second vaporization injection valve;
    vaporizing the porogen compound and flowing the porogen compound and a second carrier gas into the processing chamber;
    increasing the first organosilicon flow rate and the first porogen flow rate while depositing a transition layer in the presence of the RF power; and
    maintaining a second organosilicon flow rate and a second porogen flow rate to deposit a porogen containing organosilicate dielectric layer in the presence of the RF power.

9. The method of claim 8, wherein the first porogen flow rate is between about 200 mg/min and 600 mg/min.

10. The method of claim 9, wherein the first porogen flow rate is increased at a ramp-up rate of between about 400 mg/min./sec. and about 800 mg/min./sec.

11. The method of claim 8, wherein the organosilicon compound is selected from the group consisting of tetramethylcyclotetrasiloxane, octamethylcyclotetrasiloxane, pentamethylcyclopentasiloxane, hexamethylcyclotrisiloxane, diethoxymethylsilane, dimethyldisiloxane, tetrasilano-2,6-dioxy-4,8-dimethylene, tetramethyldisiloxane, hexamethyldisiloxane, 1,3-bis(silanomethylene)disiloxane, bis(1-methyldisiloxanyl)methane, bis(1-methyldisiloxanyl)propane, hexamethoxydisiloxane, dimethyldimethoxysilane, and dimethoxymethylvinylsilane.

12. The method of claim 8, wherein the porogen compound is selected from the group consisting of butadiene, isoprene, cyclohexadiene, bicycloheptadiene, 1-methyl-4-(1-methylethyl)-1,3-cyclohexadiene, norbornadiene, 1-methyl-4-(1-methylethyl)-Benzene, 3-carene, fenchone, limonene, cyclopentene oxide, vinyl-1,4-dioxinyl ether, vinyl furyl ether, vinyl-1,4-dioxin, vinyl furan, methyl furoate, furyl formate, furyl acetate, furaldehyde, difuryl ketone, difuryl ether, difurfuryl ether, furan, and 1,4-dioxin.

13. The method of claim 8, wherein the one or more oxidizing gases is selected from the group consisting of oxygen, ozone, nitrous oxide, carbon monoxide, and carbon dioxide.

14. The method of claim 11, wherein the organosilicon compound comprises diethoxymethylsilane and the porogen compound comprises 1-methyl-4-(1-methylethyl)-1,3-cyclohexadiene.

15. A method of depositing an organosilicate dielectric layer, comprising:

positioning a substrate within a processing chamber having a powered electrode;

flowing one or more oxidizing gases into the processing chamber;

flowing an organosilicon compound from a first bulk storage container through a first digital liquid flow meter at a first organosilicon flow rate to a first vaporization injection valve;

vaporizing the organosilicon compound and flowing the organosilicon compound and a first carrier gas into the processing chamber;

maintaining the first organosilicon flow rate for about one second to deposit an initiation layer in the presence of an RF power;

flowing a porogen compound from a second bulk storage container through a second digital liquid flow meter at a first porogen flow rate between about 200 mg/min and about 600 mg/min to a second vaporization injection valve;

vaporizing the porogen compound and flowing the porogen compound and a second carrier gas into the processing chamber;

increasing the first organosilicon flow rate and increasing the first porogen flow rate at a ramp-up rate of between about 400 mg/min./sec. and about 800 mg/min./sec. while depositing a transition layer in the presence of the RF power; and maintaining a second organosilicon flow rate and a second porogen flow rate to deposit a porogen containing organosilicate dielectric layer in the presence of the RF power.

16. The method of claim 15, wherein the organosilicon compound is selected from the group consisting of tetramethylcyclotetrasiloxane, octamethylcyclotetrasiloxane, pentamethylcyclopentasiloxane, hexamethylcyclotrisiloxane, diethoxymethylsilane, dimethyldisiloxane, tetrasilano-2,6-dioxy-4,8-dimethylene, tetramethyldisiloxane, hexamethyldisiloxane, 1,3-bis(silanomethylene)disiloxane, bis(1-methyldisiloxanyl)methane, bis(1-methyldisiloxanyl)propane, hexamethoxydisiloxane, dimethyldimethoxysilane, and dimethoxymethylvinylsilane.

17. The method of claim 15, wherein the porogen compound is selected from the group consisting of butadiene, isoprene, cyclohexadiene, bicycloheptadiene, 1-methyl-4-(1-methylethyl)-1,3-cyclohexadiene, norbornadiene, 1-methyl-4-(1-methylethyl)-Benzene, 3-carene, fenchone, limonene, cyclopentene oxide, vinyl-1,4-dioxinyl ether, vinyl furyl ether, vinyl-1,4-dioxin, vinyl furan, methyl furoate, furyl formate, furyl acetate, furaldehyde, difuryl ketone, difuryl ether, difurfuryl ether, furan, and 1,4-dioxin.

18. The method of claim 17, wherein the organosilicon compound comprises diethoxymethylsilane and the porogen compound comprises 1-methyl-4-( 1-methylethyl)-1,3-cyclohexadiene.

* * * * *